US005702987A

United States Patent [19]
Chen et al.

[11] Patent Number: 5,702,987
[45] Date of Patent: Dec. 30, 1997

[54] METHOD OF MANUFACTURE OF SELF-ALIGNED JFET

[75] Inventors: Wei Tony Chen, Singapore, Singapore; Ravishankar Sundaresan, Plano, Tex.

[73] Assignee: Chartered Semiconductor Manufacturing Pte Ltd, Singapore, Singapore

[21] Appl. No.: 703,079

[22] Filed: Aug. 26, 1996

[51] Int. Cl.$^6$ .................................................. H01L 21/337
[52] U.S. Cl. .................................................. 438/187; 438/192
[58] Field of Search .................................. 437/40–41, 911; 438/187, 192

[56] References Cited

U.S. PATENT DOCUMENTS

| | | | |
|---|---|---|---|
| 4,476,622 | 10/1984 | Cogan . | |
| 4,543,706 | 10/1985 | Bencuya et al. . | |
| 4,566,172 | 1/1986 | Bencuya et al. . | |
| 4,611,384 | 9/1986 | Bencuya et al. . | |
| 4,713,358 | 12/1987 | Bulat et al. | 437/65 |
| 5,243,209 | 9/1993 | Ishii | 257/263 |
| 5,260,227 | 11/1993 | Farb et al. | 437/41 |
| 5,294,814 | 3/1994 | Das | 257/77 |

OTHER PUBLICATIONS

Ghandhi, "VLSI Fabrication Principles Silicon and Gallium Arsenide", pp. 19–21, John Wiley & Sons, 1994 Month Unknown.

*Primary Examiner*—David Graybill
*Assistant Examiner*—Richard A. Booth
*Attorney, Agent, or Firm*—George O. Saile; Stephen B. Ackerman; Graham S. Jones, II

[57] ABSTRACT

A JFET device is formed on a semiconductor body comprising an active region for the junction field effect device. A drain region layer is formed below the lower portion of the active region. The top surface of the body is doped to provide a source region layer on the device. Gate trenches extend through the source region layer forming source regions therein. The gate trenches also extend partially through the epitaxial layer. The gate trenches have sidewalls and bottoms. Dielectric spacer layers cover the sidewalls of the gate trenches upon surfaces of the source layer and the epitaxial layer in the gate trenches. Self-aligned gate regions are formed at the bottoms of the gate trenches in doped portions of the active region.

27 Claims, 4 Drawing Sheets

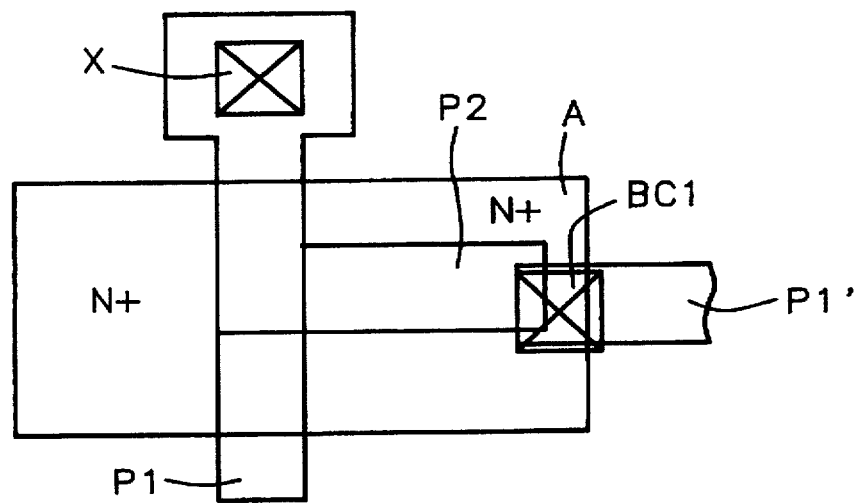
FIG. 2
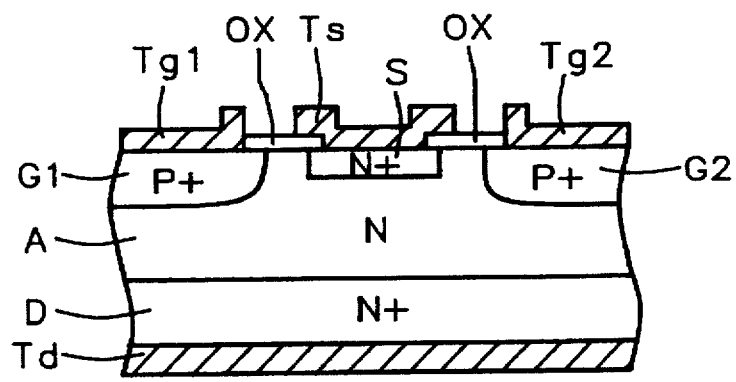
FIG. 3 - Prior Art

METHOD OF MANUFACTURE OF SELF-ALIGNED JFET

BACKGROUND OF THE INVENTION

1. Field of the Invention

This invention relates to junction field effect transistors and more particularly to a modified architecture and method of manufacture thereof.

2. Description of Related Art

A junction field-effect transistor (JFET) is unipolar device with a source electrode, a drain electrode, and at least one gate electrode which uses the depletion region of one or more reverse-biased P-N junctions to modulate the cross-sectional area available for current flow. The current is due to carriers of one polarity only. A JFET consists of a conductive channel with two ohmic contacts, one acting as the source and the other as the drain. When a positive voltage is applied to the drain with respect to the source, electrons flow from the source to the drain. The third electrode, the gate electrode(s), form(s) a rectifying junction with the channel.

FIG. 3 shows a prior art surface gate JFET with semiconductor substrate with an N doped active region A formed above an N+ drain region D. In the substrate are formed N+ gate regions G1 and G2 near the sides of source region S. Above the gate regions G1 and 62 are formed gate electrodes Tg1 and Tg2. Above the periphery of the gate regions G1 and G2 is formed an oxide dielectric layer OX with an opening therethrough with a source electrode Ts extending down to contact the source region S of the JFET. A problem is that source region S is formed between and narrowly separated from the gate regions G1 and G2. Dielectric layer OX isolates the source electrode Ts from the gate regions G1 and G2 and gate electrodes Tg1 and Tg2.

To fabricate a prior art surface gate JFET of the kind seen in FIG. 3, two critical lithography steps are required. The source region S must be aligned between the diffused gate regions G1 and G2 and the contact windows must be aligned to the diffused regions S, G1, and G2. Any misalignment can result in an electrical short circuit between a gate and a source. Such a design requires employing a critical alignment and manufacturing process for the purpose of staying within the desired margin of error and in order to reach a sufficiently high yield with the current state of the art. There is a need for a process with far less critical dimensional constraints.

SUMMARY OF THE INVENTION

A JFET device is formed on a semiconductor body comprising an active region for the junction field effect device. A drain region layer is formed below the lower portion of the active region. The top surface of the body is doped to provide a source region layer on the device. Gate trenches extend through the source region layer forming source regions therein. The gate trenches also extend partially through the epitaxial layer. The gate trenches have sidewalls and bottoms. Dielectric spacer layers cover the sidewalls of the gate trenches upon surfaces of the source layer and the epitaxial layer in the gate trenches. Self-aligned gate regions are formed at the bottoms of the gate trenches in doped portions of the active region.

In accordance with this invention, a method is provided for forming a junction field effect transistor device by the following steps. Starting with a substrate comprising a body of semiconductor material adapted for use as an active region for the junction field effect device with a top surface and a lower portion and doped with a first conductivity type of dopant, a drain region layer formed below the lower portion doped with the first conductivity type of dopant to a higher level to form a drain region, the drain region having a lower surface. Dope the top surface of the body with an additional amount of the first conductivity type of dopant to provide a source region layer on the device. Form masking material on the device. Form a mask with openings therethrough over the masking material. Then trench etch to form a plurality of gate trenches through the masking material and the source region layer forming source regions in the source region layer, and continuing the trench etching with the gate trenches extending partially through the epitaxial layer, the trenches having sidewalls and bottoms. Form a dielectric spacer layer over the sidewalls and bottoms of the gate trenches upon exposed portions of the source layer and the epitaxial layer in the gate trenches. Etch away the spacer layer from the bottoms of the gate trenches. Form a plurality of gate regions with one gate region at the bottoms of each of the gate trenches by doping a portion of the active region. Remove the remaining portions of the masking layer from the device. Then, form electrodes upon exposed surfaces of the source regions, the gate regions and the drain region.

Preferably, the masking layer provides a self-aligned mask for subsequent etching steps; the trench etching provides vertically extending sidewalls; the trench etching includes a step of etching along a {111} crystallographic plane in the active region; the spacer layer comprises a thermal oxide formed on the sidewalls and the bottom of the trenches; the drain region comprises a silicon semiconductor substrate having a <110> crystallographic orientation having a top surface and a bottom surface, the body of semiconductor material adapted for use as an active region comprises an epitaxial layer formed on the top surface of the drain region; and the mask provides a self-aligned mask for subsequent etching steps.

In accordance with still another aspect of this invention, a method of forming a junction field effect transistor device includes the following steps. Start with a semiconductor substrate doped with a first conductivity type of dopant to form a drain region having a top surface and a bottom surface, the substrate being coated on the top surface with an epitaxial semiconductor layer doped in a lesser concentration with the first conductivity type of dopant to provide an active region for the junction field effect device, the epitaxial layer having an exposed surface. Dope the surface of the epitaxial layer with an additional amount of the first conductivity type of dopant to provide a source region layer on the device. Form first and second masking material layers on the source region layer. Form a mask with openings therethrough over the first and second masking material layers. Trench etch to form a plurality of gate trenches through the masking material layers and the source region layer forming source regions in the source region layer, and continuing the trench etching with the gate trenches extending partially through the epitaxial layer, the trenches having sidewalls and bottoms. Form a dielectric spacer layer over the sidewalls and bottoms of the gate trenches upon exposed portions of the source layer and the epitaxial layer in the gate trenches. Etch away the spacer layer from the bottoms of the gate trenches. Form a plurality of gate regions with one gate region at the bottoms of each of the gate trenches in the exposed portion of the epitaxial layer by doping thereof. Remove the remaining portions of the masking layer from the device. Form electrodes upon exposed surfaces of the source regions, the gate regions and the drain region.

Preferably, the trench etching includes a step of etching along a {111} crystallographic plane in the active region; the spacer layer comprises a thermal oxide formed on the sidewalls and the bottom of the trenches; the drain region comprises a silicon semiconductor substrate having a <110> crystallographic orientation; the masking layer provides a self-aligned mask for subsequent etching steps; the trench etching comprises plasma anisotropic etching provides vertically extending sidewalls; and the trench etching includes a preliminary, orientation step of etching along a {111} crystallographic plane in the active region.

A device in accordance with this invention comprises a junction field effect transistor device with the following features. A substrate comprises a body of semiconductor material comprising an active region for the junction field effect device with a top surface and a lower portion and is doped with a first conductivity type of dopant, a drain region layer formed below the lower portion is doped with the first conductivity type of dopant to a higher level forming a drain region, the drain region layer having a lower surface. The top surface of the body is doped with an additional amount of the first conductivity type of dopant to provide a source region layer on the device. A plurality of gate trenches extending through the source region layer form source regions in the source region layer, and continuing the trench with the gate trenches extend partially through the epitaxial layer, the trenches having sidewalls and bottoms. There are dielectric spacer layers over the sidewalls of the gate trenches upon surfaces of the source layer and the epitaxial layer in the gate trenches, and a plurality of gate regions with one gate region at the bottoms of each of the gate trenches in doped portions of the active region. Electrodes are formed upon exposed surfaces of the source regions, the gate regions and the drain region.

Preferably, the trenches have vertically extending sidewalls; the trenches have a wall etched along a {111} crystallographic plane in the active region; the spacer layer comprises a thermal oxide formed on the sidewalls; the drain region comprises a silicon semiconductor substrate having a <110> crystallographic orientation having a top surface and a bottom surface, the body of semiconductor material adapted for use as an active region comprises an epitaxial layer on the top surface of the drain region and; the gate regions are self-aligned with the source regions.

BRIEF DESCRIPTION OF THE DRAWINGS

The foregoing and other aspects and advantages of this invention are explained and described below with reference to the accompanying drawings, in which:

FIG. 1E shows a completed JFET device 10 made in accordance with the new JFET architecture and the new process of this invention.

FIG. 2 shows a top view of a device in accordance with this invention.

FIG. 3 shows a prior art surface gate JFET with semiconductor substrate with an N doped active region A formed above an N+ drain region D.

DESCRIPTION OF THE PREFERRED EMBODIMENT

Figure 1A:
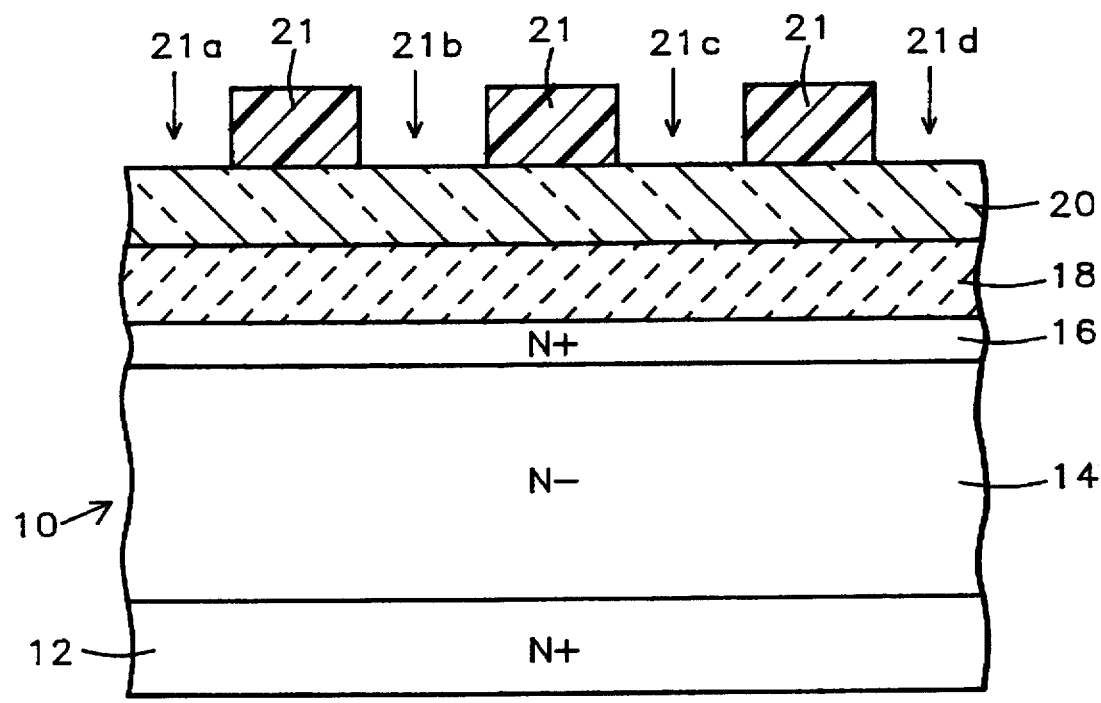
FIGS. 1A to 1E show the process steps for forming the device of FIG. 1E in accordance with this invention.
Figure 1B:
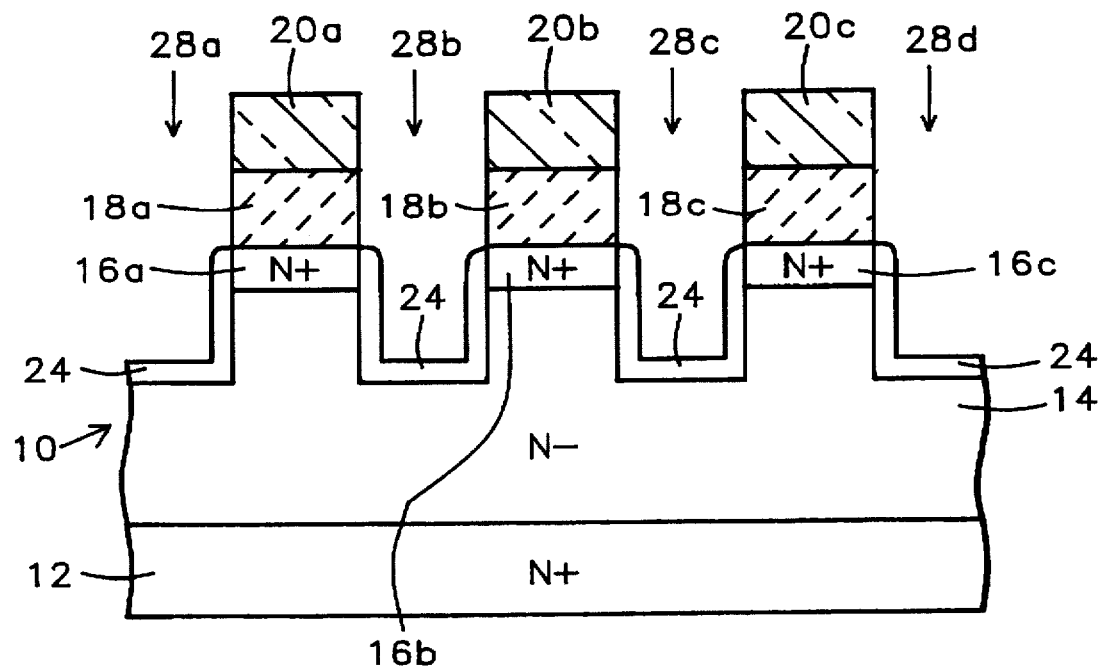
Figure 1C:
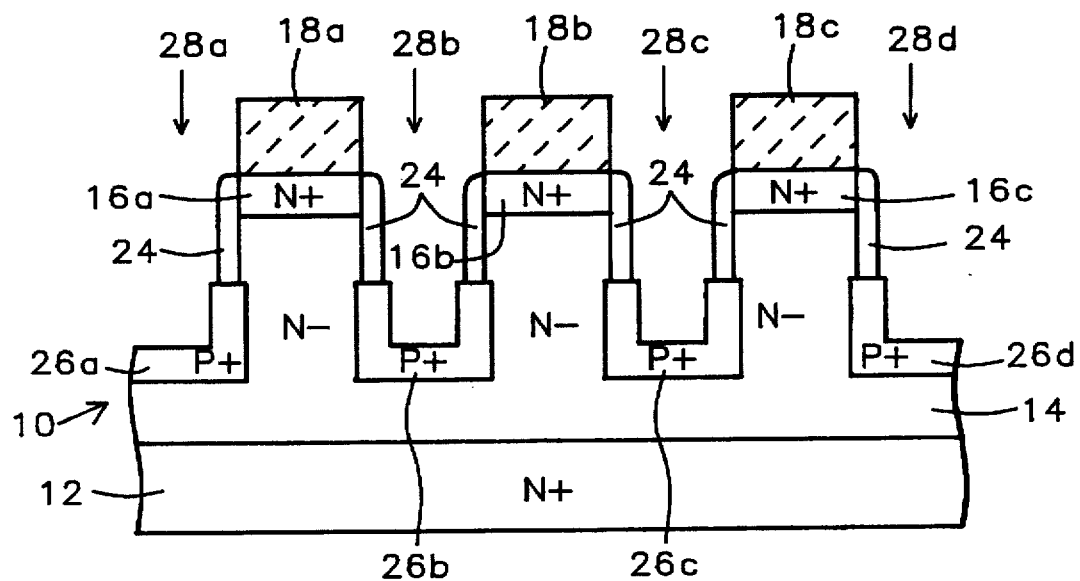
Figure 1D:
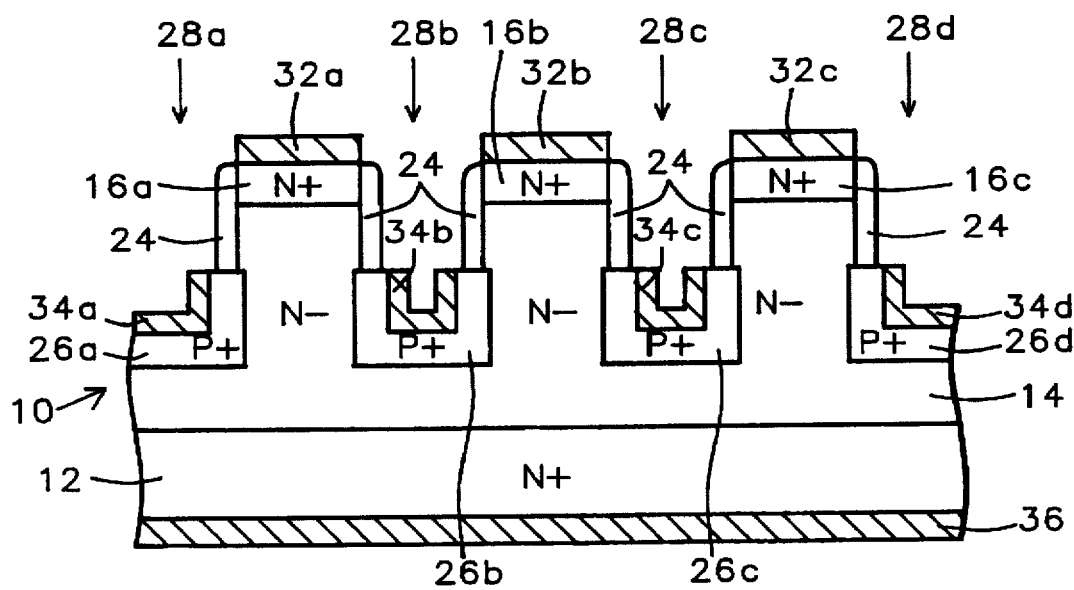
Figure 1E:
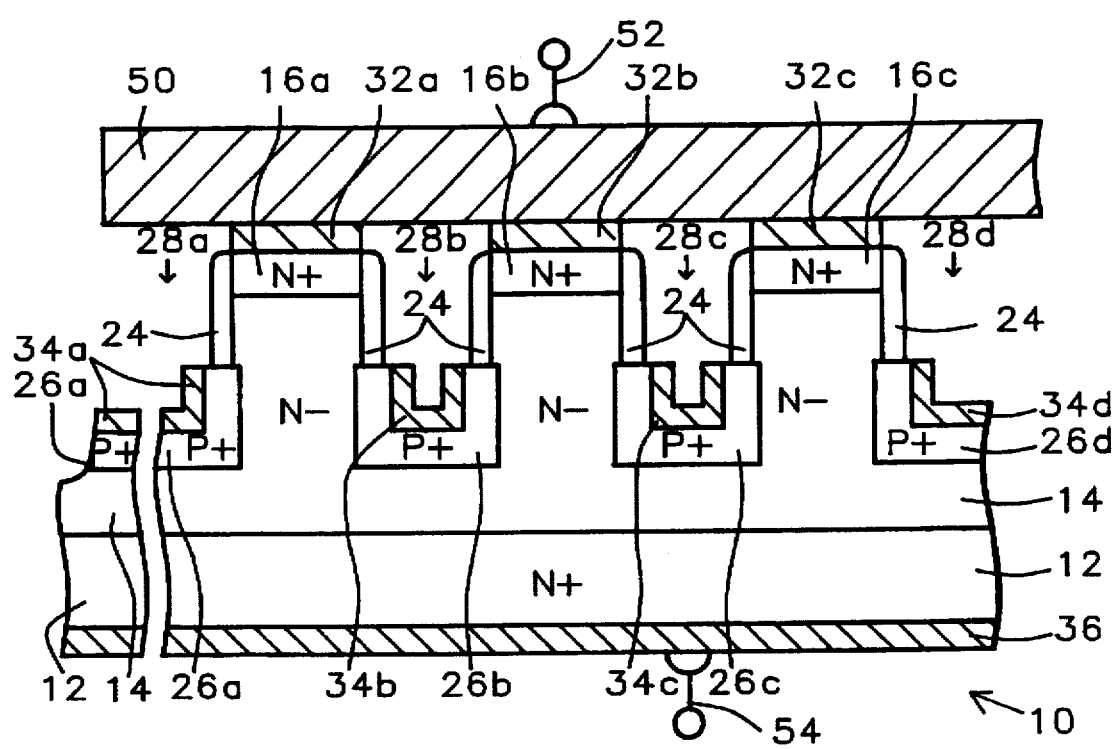

FIG. 1E shows a completed JFET device 10 made in accordance with the new JFET architecture and the new process of this invention. JFET device 10 is formed on a silicon semiconductor substrate the bulk of which is shown as an epitaxially deposited, N- doped active silicon layer 14 on an N+ silicon <110> crystallographic orientation substrate 12. On the top surface of the epitaxial layer 14 is formed a set of N+ doped source regions 16a, 16b and 16c which are separated by a series of trenches 28a-28d etched down into the N+ source layer and the N- doped, epitaxial layer 14.

The source regions 16a, 16b and 16c are connected to respective source region electrodes 32a, 32b and 32c which, in turn, are connected together through individual connections to the lower surface of electrical bus line plate 50, which is connected to terminal 52. The source electrodes 32a, 32b, 32c and 32d can be connected together for the purpose of providing high current as shown in FIG. 1E or they can be connected to independent and separate nodes for alternative applications.

Between the N+ doped source regions 16a, 16b and 16c the set of trenches 28a, 28b, 28b and 28d formed in the substrate extending down in epitaxial, N- doped active region 14 with dielectric spacers 24, lining the walls of the trenches 28a-28d.

A set of P+ doped gate regions 26a, 26b, 26c and 26d is formed with one in the bottom of each of the trenches 28a, 28b, 28c and 28d. The gate regions 26a, 26b, 26c and 26d have respective gate electrodes 34a, 34b, 34c and 34d formed on their surfaces at the bottom of the trenches 28a-28d. The gate electrodes 34a-34d can also be connected together to provide high current. As stated above, the source electrodes 16a-16d have also been illustrated in the option of connection thereof to electrical bus line plate 50 to provide high current in the bus line 50 and in the attached conductor 52.

Below the epitaxial layer 14 is formed the N+ doped silicon, layer 12 formed in the substrate of device 10. Layer 12 serves as the drain region of the three JFET devices formed with the sources 16a-16c and the associated set of two gates 26a-26b, 26b-26c and 26c-26d respectively for each source region 28a-28c. The electrode 36 is connected to the bottom surface of the N+ doped silicon substrate 13 as the drain connection to line 54 which is the external drain terminal of all of the JFET transistors in the device 10 of FIG. 1E.

On the left end of the device of FIG. 1E, a portion 48 of device 10 is shown extending well beyond the end of electrical bus line plate 50. The portion 48 includes contact metallization layer 36, drain region 12, N- doped epitaxial layer 14, P+ gate electrodes 26a, and contact 34a extend to the left of the end of metal, electrical bus line plate 50. This design is employed since integrated circuit devices are etched and then cut in between device areas to separate them from other devices on the wafer.

Manufacturing Process

The manufacturing process of the invention requires only a single mask 21 seen in FIG. 1A which is formed on a polished surface of silicon dioxide layer 20.

When employing the process of this invention, no critical alignments are required and the architecture of the new JFET devices provides much greater protection against gate to source electrical short circuits. Accordingly device yield is enhanced significantly.

The process steps for forming the device of FIG. 1E are described below with reference to FIGS. 1A to 1E.

FIG. 1A shows an N+ doped silicon semiconductor substrate (drain region) 12 with an N- doped, epitaxial, silicon (active region) layer 14 formed thereon with a <110> crystallographic orientation lattice structure. For a 400 V device, the N– epitaxial layer 14 is preferably about 40 μm thick and N– epitaxial layer 14 contains dopant with a preferred concentration of 1 E 14 atoms/cm$^3$ (with a maximum range from about 1 E 14 atoms/cm$^3$ to about 5 E 14 atoms/cm$^3$). Substrates with N– epitaxial layers 14 are available on the market as commodities. Layer 12 will serve as the drain region of the JFET transistors as seen in FIGS. 1C, 1D and 1E.

Next an N+ layer 16 is formed on layer 14 by an N+ diffusion of phosphorus (P) or arsenic (As) dopant into layer 14. The dopant is diffused into layer 14 with a concentration from about 1 E 19 atoms/cm$^3$ to about 1 E 20 atoms/cm$^3$. The layer 16 is formed for use as source regions as well as an ohmic contact, is less than one micrometer (<1 μm or 10,000 Å) thick (with a range of thicknesses from about 5,000 Å to about 7,000 Å. Instead of a diffusion, region 16 can be formed by ion implantation with arsenic dopant.

The surface of layer 16 is coated with a silicon nitride ($Si_xN_y$) layer 18 deposited with a thickness from about 1,000 Å to about 3,000 Å.

Above the exposed surface of silicon nitride ($Si_xN_y$) layer 18, a silicon dioxide ($SiO_2$) layer 20 is deposited with a thickness from about 800 Å to about 1,200 Å.

A photoresist mask 21 with openings 21a, 21b, 21c, and 21d has been formed over the device 10 covering the silicon dioxide layer 20 in preparation for etching through the openings 21a–21d with the remainder of the device being protected by mask 21. Mask 21 is to be used in a one mask-photolithographic step which requires no alignment to form the gate by patterning through silicon dioxide layer 20 removing portions thereof between sections 20a, 20b, and 20c and silicon nitride layer 18. The layers 20 and 18 removing portions thereof between sections 18a, 18b, and 18c, then comprise a self-aligned mask of silicon dioxide ($SiO_2$) and silicon nitride ($Si_xN_y$) which is used to pattern the remaining features of the device 10 in a series of self-aligned processing steps.

A self-aligned $SiO_2/Si_xN_y$ mask is formed over the device for use in a wet or dry plasma etching process is used to etch the silicon dioxide layer 20. The process used is a conventional process as will be well understood by those skilled in the art.

Etching of Trenches in Silicon Layers

FIG. 1B shows the product of FIG. 1A after etching through the self-aligned mask of silicon dioxide ($SiO_2$) layer 20 and silicon nitride ($Si_xN_y$) layer 18 to form the mask described above.

Subsequently, the mask formed of layers 18 and 20 is used during etching with either a standard plasma dry etching process with a gas such as $CF_4$ or with a wet solution of potassium hydroxide (KOH) to form an array of trenches 28a, 28b, 28c and 28d, etc. through layer 16 and deep down into layer 14. The trenches are etched to a relatively shallow depth (less than shown in the drawings) of from about 5 μm to about 8 μm in the layers 14 and 16.

Preferably, a first orientation etch is performed with an aqueous solution of KOH along a <111> crystallographic plane giving a vertical wall to trenches 28a, 28b, 28c and 28d, etc. While a wet etch with the aqueous solution of KOH is preferred, a dry plasma etch is a possible alternative.

After the first KOH etching a step follows of oxidation of the newly exposed surfaces in the trenches 28a, 28b, 28c and 28d of the newly exposed sidewall surfaces of N+ layer 16 and N-doped epitaxial layer 14. The result is the formation of silicon oxide sidewall and bottom layers 24 on the sidewalls and bottom the exposed surfaces of the N-doped epitaxial layer 14 and N+ layer 16 in the trenches 28a–28d. The sidewalls and bottoms 24 are formed by a thermal oxidation process which forms a layer with a thickness from about 800 Å to about 1,200 Å on the layers 14 and 18 in the trenches 28a, 28b, 28c and 28d, etc.

FIG. 1C shows the product of FIG. 1B after a step of reactive ion etching away the bottom portions of the spacer oxide layers 24 as well as etching away the silicon oxide on top of the source regions 16a, 16b and 16c with a process of dry anisotropic plasma etch using RIE (Reactive Ion Etching) with a typical etchant gas (a text book gas well known to those skilled in the art) to etch away the silicon dioxide at the bottom of the trenches 28a–28d and to etch away the oxide on top of the silicon nitride layers leaving spacers 24 in the trenches 28a, 28b, 28c and 28d, etc. This dry anisotropic, vertical etch of N doped epitaxial layer 14, which removes further material below the trenches 28a–28d from about 5 μm to about 8 μm in depth, which means that the trenches 28a–28d have an overall depth from about 10 μm to about 16 μm. A step of etching with $CF_4$ gas is used to etch the epitaxial layer 14.

Next follows an anisotropic, vertical etch using etching (either a dry plasma etch or a KOH wet etch) from about 5 μm to about 8 μm in depth. Preferably a step of etching with $CF_4$ gas is used for this etching step.

Then a P+ boron ($B^{11}$) ion diffusion is performed into portions of the N-epitaxial layer 14 is made below the spacers 24. The boron is diffused into trenches 28a–28d down into the exposed surface of the epitaxial layer 14 to form P+ gate electrodes 26a, 26b, 26b and 26d at the base of the trenches 28a–28d.

Note that the oxide layer on top has been removed and that the N+ layers 16 below $Si_3N_4$ layers 18 form source regions 16a. . . . Note also the self-alignment; as well as the P+ Boron [11] ion diffusion into portions of the N-epitaxial layer 14 below the spacers 24 in the base of trenches 28a, 28b, 28c and 28d and extending up along the trenches 28a, 28b, 28c and 28d towards the source regions 16a, 16b, and 16c.

FIG. 1D shows the product of FIG. 1C after removing the remaining silicon nitride films 18 from the top of the source regions 16a, 16b and 16c by, for example, wet etching with hot phosphoric acid ($H_3PO_4$) solution leaving the oxide sidewall spacers 24 from oxide layer 24.

Then a process of electroless plating with nickel and gold follows over the exposed N+ silicon layer 16 and epitaxial N doped silicon layer 14 to form self-aligned metal contacts in three separate locations. Contacts 34a, 34b, 34c and 34d are formed at the base of the trenches 28a, 28b, 28c and 28d on top of the gate electrodes 26a, 26b, 26c and 26d. Contacts 32a, 32b and 32c are formed on top of the source regions 16a, 16b and 16c. Contact metallization layer 36 is formed on the base of drain region 12.

Electroless Ni or Au, etc. were then coated by plating to form metal electrodes 32a, 32b, 32c and 32d on the source regions 16a–16d and electrodes 34a, 34b, 34c and 34d on the gate regions 26a–26d. In addition, electrical and mechanical contact is made to the back side using aluminum as drain (anode.)

Then conventional steps follow including using photoresist to protect circuit area and etch away other areas to form JFET devices. Then a metal plate 50 is connected by thermal bonding to Au or Ni metal in layers 32a–32d.

FIG. 2 shows a top view of a device in accordance with this invention. The device includes the N+ doped active region A, polysilicon P1, with the shaded layer of polysilicon P2 overlying portions of layer P1. An additional layer of polysilicon P1' is shown in contact with buried contact BC1. A contact X is provided between the polysilicon layer P1 and P2 where they are overlapped aside from the active region A at the top of FIG. 2. By including buried contact BC1, the advantages are as follows:

1) It is possible to reduce the number of polysilicon layers, and
2) A currently used double polysilicon SRAM process may be used with very little modification.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a junction field effect transistor device by the steps comprising:

providing a substrate comprising a body of an epitaxial layer of semiconductor material having a <110> crystallographic orientation adapted for use as an active region for said junction field effect device with a top surface and a lower portion and doped with a first conductivity type of dopant, a drain region layer having a <110> crystallographic orientation formed below said lower portion doped with said first conductivity type of dopant to a higher level than said body of an epitaxial layer of said semiconductor material to form a drain region, said drain region having a lower surface, doping said top surface of said body with an additional amount of said first conductivity type of dopant to provide a source region layer on said top surface of said body, forming masking material on said body, forming a photoresist mask with mask openings therethrough over said masking material, and etching patterned openings in said masking material through said mask openings, trench etching to form a plurality of gate trenches through said patterned openings in said masking material and said source region layer forming source regions in said source region layer having exposed portions, and continuing said trench etching with said gate trenches extending partially through said epitaxial layer, said trenches having sidewalls and bottoms, said trench etching comprising etching through said source region layer and said epitaxial layer along a {111} crystallographic plane, forming a dielectric spacer layer over said sidewalls and bottoms of said gate trenches upon exposed portions of said source region layer and said epitaxial layer in said gate trenches, etching through said patterned openings in said masking material to remove said spacer layer from said bottoms of said gate trenches, and etching below said bottoms deepening said trenches, forming a plurality of gate regions with one gate region at the bottoms of each of said gate trenches by doping a portion of said active region, removing said masking material from said body, and forming electrodes upon exposed surfaces of said source regions, said gate regions and said drain region.

2. A method in accordance with claim 1 wherein said masking material provides a self-aligned mask for etching through said patterned openings in said masking material during subsequent etching steps including etching away said spacer layer from said bottoms of said gate trenches.

3. A method in accordance with claim 1 wherein said trench etching through said patterned openings in said masking material provides vertically extending sidewalls.

4. A method in accordance with claim 1 wherein said spacer layer comprises a thermal oxide formed on said sidewalls and the bottoms of said trenches.

5. A method in accordance with claim 1 wherein said drain region comprises a silicon semiconductor substrate having <110> crystallographic orientation and having a top surface and a bottom surface, said body of semiconductor material adapted for use as an active region comprises an epitaxial layer formed on said top surface of said drain region.

6. A method in accordance with claim 5 wherein said masking material comprises a lower silicon nitride layer and upper silicon dioxide layer which provide a self-aligned mask for etching through said patterned openings in said masking material provides a self-aligned mask for subsequent etching steps.

7. A method in accordance with claim 6 wherein said trench etching through said patterned openings in said masking material comprises plasma anisotropic etching providing vertically extending sidewalls.

8. A method in accordance with claim 7 wherein said spacer layer comprises a thermal oxide formed on said sidewalls and the bottoms of said trenches.

9. A method of forming a junction field effect transistor device by the steps comprising:

starting with a semiconductor substrate with a <110> crystallographic orientation doped with a first conductivity type of dopant to form a drain region having a top surface and a bottom surface, said substrate being coated on said top surface with an epitaxial semiconductor layer having a <110> crystallographic orientation, said epitaxial semiconductor layer being doped in a lesser concentration than said drain region with said first conductivity type of dopant to provide an active region for said junction field effect device, said epitaxial layer having an exposed surface, doping the surface of said epitaxial layer with an additional amount of said first conductivity type of dopant to provide a source region layer on the surface of said epitaxial layer, forming first and second masking material layers on said source region layer, forming a mask with mask openings therethrough over said first and second masking material layers, and forming patterned openings in said masking material through said mask openings, and removing said mask from over said first and second masking material layers, trench etching to form a plurality of gate trenches through said patterns in said masking material layers and said source region layer forming source regions in said source region layer, and continuing said trench etching with said gate trenches extending partially through said epitaxial layer, said trenches having sidewalls and bottoms, said trench etching comprising etching through said source region layer and said epitaxial layer along a {111} crystallographic plane, forming a dielectric spacer layer over said sidewalls and bottoms of said gate trenches upon exposed portions of said source region layer and said epitaxial layer in said gate trenches, etching away said spacer layer from said bottoms of said gate trenches through said patterned openings in said masking material and etching below said bottoms deepening said trenches, forming a plurality of gate regions with one gate region at the each of the bottoms of each of said gate trenches in said epitaxial layer by doping thereof by diffusion, removing said masking material layers, and forming electrodes upon exposed surfaces of said source regions, said gate regions and said drain region.

10. A method in accordance with claim 9 wherein said mask over said first and second masking material layers provides a self-aligned mask for subsequent etching steps.

11. A method in accordance with claim 9 wherein said trench etching comprises plasma anisotropic etching providing vertically extending sidewalls.

12. A method in accordance with claim 9 wherein said spacer layer comprises a thermal oxide formed on said sidewalls and the bottoms of said trenches.

13. A method in accordance with claim 12 wherein said mask provides a self-aligned mask for subsequent etching steps.

14. A method in accordance with claim 13 wherein said trench etching comprises plasma anisotropic etching provides vertically extending sidewalls.

15. A method in accordance with claim 14 wherein said trench etching includes a preliminary, orientation step of etching along a {111} crystallographic plane in said active region.

16. A method in accordance with claim 15 wherein said spacer layer comprises a thermal oxide formed on said sidewalls and the bottom of said trenches.

17. A method of forming a junction field effect transistor device by the steps comprising:

starting with a semiconductor substrate with a <110> crystallographic orientation doped with a first conductivity type of dopant to form a drain region having a top surface and a bottom surface, said substrate being coated on said top surface with an epitaxial semiconductor layer having a <110> crystallographic orientation, said epitaxial semiconductor layer being about 40 μm thick, said epitaxial semiconductor layer being doped with a doping concentration of from about 1 E 14 atoms/cm$^3$ to about 5 E 14 atoms/cm$^3$, said doping concentration being less than the doping concentration in said drain region with said first conductivity type of dopant to provide an active region for said junction field effect device, said epitaxial layer having an exposed surface, doping the surface of said epitaxial layer with an additional amount of said first conductivity type of dopant to provide a source region layer on the surface of said epitaxial layer with a doping concentration from about 1 E 19 atoms/cm$^3$ to about 1 E 20 atoms/cm$^3$, forming first and second masking material layers on said source region layer composed of a silicon nitride lower masking material layer below a silicon dioxide upper masking material layer, forming a mask with openings therethrough over said first and second masking material layers and forming patterns in said first and second masking material layers through said openings, trench etching in an orientation etch performed along the {111} crystallographic plane to form a plurality of gate trenches through said masking material layers and said source region layer forming source regions in said source region layer, and continuing said trench etching with said gate trenches extending partially through said epitaxial layer, said trenches having sidewalls and bottoms, said trench etching comprising etching through said source region layer and said epitaxial layer along said {111} crystallographic plane providing vertically extending sidewalls, forming a dielectric spacer layer over said sidewalls and bottoms of said gate trenches upon exposed portions of said source region layer and said epitaxial layer in said gate trenches, etching away said spacer layer from said bottoms of said gate trenches, forming a plurality of gate regions with one gate region at the each of the bottoms of each of said gate trenches in said epitaxial layer by doping thereof by diffusion, removing said masking material layers, and forming electrodes upon exposed surfaces of said source regions, said gate regions and said drain region.

18. A method in accordance with claim 17 wherein said masking layers provide a self-aligned mask for subsequent etching steps.

19. A method in accordance with claim 17 wherein said trench etching comprises plasma anisotropic etching.

20. A method in accordance with claim 17 wherein said spacer layer comprises a thermal oxide formed on said sidewalls and the bottoms of said trenches.

21. A method in accordance with claim 17 wherein said mask over said first and second masking material layers provides a self-aligned mask for subsequent etching steps.

22. A method in accordance with claim 17 wherein said masking layers provide a self-aligned mask for subsequent etching steps, and said trench etching comprises plasma anisotropic etching.

23. A method in accordance with claim 22 wherein said spacer layer comprises a thermal oxide formed on said sidewalls and the bottoms of said trenches.

24. A method in accordance with claim 22 wherein said mask over said first and second masking material layers provides a self-aligned mask for subsequent etching steps.

25. A method in accordance with claim 17 wherein said masking layers provide a self-aligned mask for subsequent etching steps, said trench etching comprises plasma anisotropic etching, said spacer layer comprises a thermal oxide formed on said sidewalls and the bottoms of said trenches, and said mask over said first and second masking material layers provides a self-aligned mask for subsequent etching steps.

26. A method of forming a junction field effect transistor device by the steps comprising starting with a semiconductor substrate with a <110> crystallographic orientation doped with a N+ conductivity type of dopant to form a drain region having a top surface and a bottom surface, said substrate being coated on said top surface with an epitaxial semiconductor layer having a <110> crystallographic orientation, said epitaxial semiconductor layer being about 40 μm thick, said epitaxial semiconductor layer being doped with a N- conductivity type of dopant doping concentration of from about 1 E 14 atoms/cm$^3$ to about 5 E 14 atoms/cm$^3$, said doping concentration being less than said drain region with said first conductivity type of dopant to provide an active region for said junction field effect device, said epitaxial layer having an exposed surface, doping the surface of said epitaxial layer with an additional amount of said N conductivity type of dopant to provide a source region layer on the surface of said epitaxial layer with a doping concentration of from about 1 E 19 atoms/cm$^3$ to about 1 E 20 atoms/cm$^3$, forming first and second masking layers on said source region layer composed of a silicon nitride lower masking layer below a silicon dioxide upper masking layer, forming a mask with openings therethrough over said first and second masking layers and forming mask patterns in said masking layers through said openings, trench etching in an orientation etch performed along the {111} crystallographic plane with an etchant selected from the group consisting of an aqueous solution of KOH and a dry plasma etch to form a plurality of gate trenches through said mask openings in said masking layers and said source region layer forming source regions in said source region layer, and continuing said trench etching with said gate trenches extending partially through said epitaxial layer, said trenches having vertically extending sidewalls comprising exposed portions of said source region layer and said epitaxial layer and having bottoms below said sidewalls, forming a dielectric spacer layer with a thickness from about 800 Å to about 1,200 Å by forming a thermal oxide on said sidewalls and the said bottoms of said gate trenches, etching away said spacer layer from said bottoms of said gate trenches, etching away said silicon dioxide upper masking layer with a dry anisotropic RIE etchant gas, etching said N-doped epitaxial layer with CF$_4$ gas to provide an overall depth of said trenches from about 10 μm to about 16 μm, forming a plurality of gate electrode regions with one gate region at the each of the bottoms of each of said gate trenches doped by diffusion of P+ boron (B$^{11}$) into said epitaxial layer, removing said masking layers, and forming contacts upon exposed surfaces of said source regions, said gate electrode regions and said drain region.

27. A method in accordance with claim 26 wherein said masking layers provides a self-aligned mask for subsequent etching steps, said trench etching comprises plasma anisotropic etching, said spacer layer comprises a thermal oxide formed on said sidewalls and the bottoms of said trenches, and said mask over said first and second masking material layers provides a self-aligned mask for subsequent etching steps.

* * * * *